(12) United States Patent
Herfurth et al.

(10) Patent No.: US 10,148,175 B2
(45) Date of Patent: *Dec. 4, 2018

(54) SYSTEM AND METHOD FOR A SWITCHED-MODE POWER SUPPLY

(71) Applicant: Infineon Technologies Austria AG, Villach (AT)

(72) Inventors: Michael Herfurth, Gilching (DE); Xiao Wu Gong, Singapore (SG)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/964,505

(22) Filed: Apr. 27, 2018

(65) Prior Publication Data

US 2018/0248480 A1   Aug. 30, 2018

Related U.S. Application Data

(63) Continuation of application No. 14/673,128, filed on Mar. 30, 2015, now Pat. No. 9,991,791.

(51) Int. Cl.
*H02M 3/157* (2006.01)
*H05B 33/08* (2006.01)
(Continued)

(52) U.S. Cl.
CPC ........ *H02M 3/157* (2013.01); *H05B 33/0815* (2013.01); *G01R 19/2503* (2013.01);
(Continued)

(58) Field of Classification Search
CPC ........ H02M 1/007; H02M 7/04; H05B 37/02; G05F 1/00
(Continued)

(56) References Cited

U.S. PATENT DOCUMENTS 4,700,180 A   10/1987 Vance
5,203,028 A   4/1993 Shiraishi
(Continued)

FOREIGN PATENT DOCUMENTS

CN   101873059 A   10/2010
CN   201813590 U   4/2011
(Continued)

OTHER PUBLICATIONS

"Non-isloated Buck Offline LED Driver," BP2832A, Rev. 1.0, BPSemiconductor, www.bpsemi.com, Jun. 2014, 8 pgs.
(Continued)

*Primary Examiner* — Wei Chan
(74) *Attorney, Agent, or Firm* — Slater Matsil, LLP (57) ABSTRACT

In accordance with an embodiment, a method of operating a switched-mode power converter includes measuring an input voltage of the switched-mode power converter; determining an on-time of a switch of the switched-mode power converter; determining an off-time of the switch of the switched-mode power converter; and determining an output voltage of the switched-mode power converter based on the measured input voltage, the determined on-time and the determined off-time. The output voltage includes a voltage at a first node having a DC path to a load path of the switch.

27 Claims, 6 Drawing Sheets

(51) Int. Cl.
*G01R 31/40* (2014.01)
*H02M 1/00* (2006.01)
*H02M 1/32* (2007.01)
*G01R 19/25* (2006.01)

(52) U.S. Cl.
CPC ............... *G01R 31/40* (2013.01); *H02M 1/32* (2013.01); *H02M 2001/0003* (2013.01); *Y02B 20/346* (2013.01)

(58) Field of Classification Search
USPC ................... 315/119, 224, 294, 291; 363/84
See application file for complete search history.

(56) References Cited

U.S. PATENT DOCUMENTS

| | | |
|---|---|---|
| 6,302,545 B1 | 10/2001 | Schofield et al. |
| 8,773,031 B2 | 7/2014 | Sadwick et al. |
| 8,928,231 B2 | 1/2015 | Campos et al. |
| 2008/0012502 A1 | 1/2008 | Lys |
| 2008/0130336 A1 | 6/2008 | Taguchi |
| 2010/0026208 A1 | 2/2010 | Shteynberg et al. |
| 2010/0148681 A1 | 6/2010 | Kuo et al. |
| 2010/0148691 A1 | 6/2010 | Kuo et al. |
| 2010/0156319 A1 | 6/2010 | Melanson |
| 2010/0207536 A1 | 8/2010 | Burdalski et al. |
| 2010/0308733 A1 | 12/2010 | Shao |
| 2011/0018914 A1 | 1/2011 | Ishikawa et al. |
| 2011/0254525 A1 | 10/2011 | Gaknoki et al. |
| 2012/0002449 A1 | 1/2012 | Park et al. |
| 2012/0212145 A1 | 8/2012 | Chan et al. |
| 2013/0119881 A1 | 5/2013 | Fang et al. |
| 2013/0162165 A1 | 6/2013 | Saes |
| 2013/0307431 A1 | 11/2013 | Zhu et al. |
| 2014/0029315 A1 | 1/2014 | Zhang et al. |
| 2014/0139111 A1 | 5/2014 | Lin et al. |
| 2014/0225760 A1 | 8/2014 | Yang |
| 2014/0268950 A1 | 9/2014 | Medina-Garcia |
| 2015/0115822 A1* | 4/2015 | Cha ................... H05B 33/0815 315/200 R |

FOREIGN PATENT DOCUMENTS

| | | |
|---|---|---|
| CN | 102150093 A | 8/2011 |
| CN | 202050564 U | 11/2011 |
| CN | 102448223 A | 5/2012 |
| CN | 203233150 U | 10/2013 |
| CN | 103516191 A | 1/2014 |
| CN | 104270020 A | 1/2015 |

OTHER PUBLICATIONS

"Off-Line Digital Power Controller for LED Driver with High Power Factor and Low-Ripple Current," iW3625 Product Summary, Rev. 0.2 Preliminary, Dialog Semiconductor (UK) Ltd., 2014, 5 pgs.
"AC/DC Advanced Digital Power Controller for Single-Stage Dimmable LED Drivers," iW3688 Product Summary, Rev. 0.8 Preliminary, Dialog Semiconductor (UK), 2014, 6 pgs.
"Mains dimmable controller for LED lighting," SSL5301T, Preliminary Data Sheet, Rev. 1, Jun. 2, 2014, 22 pgs.

* cited by examiner

SYSTEM AND METHOD FOR A SWITCHED-MODE POWER SUPPLY

This application is a continuation of U.S. patent application Ser. No. 14/673,128, filed Mar. 30, 2015, which application is hereby incorporated herein by reference in its entirety.

TECHNICAL FIELD

The present disclosure relates generally to an electronic device, and more particularly to a system and method for a switched mode power supply.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy loss due to power dissipation across resistive voltage drops.

A SMPS usually includes at least one switch and an inductor or transformer. Some specific topologies include buck converters, boost converters, and flyback converters, among others. A control circuit is commonly used to open and close the switch to charge and discharge the inductor. In some applications, the current supplied to the load and/or the voltage supplied to the load is controlled via a feedback loop.

One application of a SMPS is as a power supply for a light emitting diode (LED), such as those used in residential and commercial lighting applications to replace incandescent light bulbs and compact florescent lamps (CFL). In some applications, a SMPS is used to convert an AC line voltage to a DC current in order to power the LED.

SUMMARY OF THE INVENTION

In accordance with an embodiment, a method of operating a switched-mode power converter includes measuring an input voltage of the switched-mode power converter; determining an on-time of a switch of the switched-mode power converter; determining an off-time of the switch of the switched-mode power converter; and determining an output voltage of the switched-mode power converter based on the measured input voltage, the determined on-time and the determined off-time. The output voltage includes a voltage at a first node having a DC path to a load path of the switch.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for switched mode buck converter for light emitting diodes (LEDs). Embodiments of the present invention may also be applied to other switched-mode power supply configurations and other systems and applications including other circuits that switch including, but not limited to, power systems and motor control systems.

In many conventional LED lighting systems, LEDs are powered using a switched mode power supply having a control system that regulates the average output current delivered to the LED. By regulating the average output current of the switched-mode power supply, the light intensity provided by the LED can be controlled. For example, by lowering the average current provided to the LED, the light output can be made dimmer while increasing the average current provided to LED can make the light output brighter. During normal operation of an LED, the output voltage of the switched mode power supply is generally determined by the junction voltage of the LEDs, which has a logarithmic relationship to the current of the LED. In many systems, multiple LEDs may be driven by a switched-mode power supply. These LEDs may be coupled in series, in parallel, or in a combination of series and parallel circuits.

If the LEDs are removed from the switched-mode power supply, however, the current regulation loop will attempt to continue providing the constant current to its output terminals. Because the switched-mode power supply is presented with a high impedance load with the removal of the LEDs, the attempt to supply a constant current will cause an increase in the output voltage of the switched-mode power supply. If this voltage continues to increase beyond the safe operating voltages of the various power supply components, damage to the power supply output stage may result, as well as the potential for a fire hazard caused by arcing or heating of the components. This is especially pertinent in switched-mode buck converters that operate off an AC power-line voltages of 110V or 220V. One way to address the issue of hazardous over-voltage conditions is to measure the output voltage of the switched-mode power supply and shutdown the switched mode power supply when the output voltage exceeds a predetermined threshold.

There are a number of conventional circuits and methods that may be used to measure the output voltage of a switched-mode power supply. For example, an auxiliary winding coupled to a main transformer of a flyback converter could be used to provide an output voltage measurement to the primary side of the switched-mode power supply. Another conventional method includes measuring the demagnetization time Tovp of an inductance within the switched-mode power supply. For example, demagnetization time Tovp of a switched-mode power supply may calculated as follows:

$$T_{ovp} = \frac{L \times V_{CS}}{R_{CS} \times V_{ovp}}, \quad (1)$$

where L is the inductance of the inductor coupled to the power supply switch, $R_{CS}$ is the resistance of a resistor coupled in series with the source of a switching transistor, $V_{CS}$ is the voltage across resistance $R_{CS}$ and $V_{OVP}$ is the output voltage that corresponds to $T_{ovp}$. As is clear from equation (1), demagnetization time Tovp is proportional to the inductance L of the power supply inductor. Moreover, the accuracy of the demagnetization time method may also be dependent on the absolute value of a capacitance of a timing capacitor and/or the time constant of an RC circuit used to measure $T_{ovp}$. Because of the potentially wide tolerance of the value of inductance L, the timing capacitance and/or the RC time constant, the resulting measurement may also have a wide tolerance, resulting in inaccurate measurements.

In an embodiment of the invention, the output voltage of a switched-mode power converter is estimated based on the input voltage of the switched-mode power supply, the on-time of the switch and the off-time of the switch. In some embodiments, the output voltage of the switched-mode power supply is estimated based on the input voltage of the switched-mode power supply and the duty cycle of the switching signal sent to the switch.

In one specific embodiment, a buck converter for powering a light emitting diode includes a buck converter circuit having a switch coupled in series with a cascode transistor. An inductor and a freewheeling diode are coupled to the drain of the cascode transistor, and a load, such as an LED is coupled to the inductor. During operation, a pulse width modulated signal is provided to the switch in order to control the current through the switch to a first predetermined current. The input voltage to the buck converter is monitored along with the duty cycle of the pulse width modulated signal and/or the on and off times of the pulse width modulated signal, and an output voltage is estimated based on these values. In some embodiments, the estimated output voltage is compared with a predetermined threshold, and the power supply is shut down when the estimated output voltage exceeds the predetermined threshold.

Figure 1A:
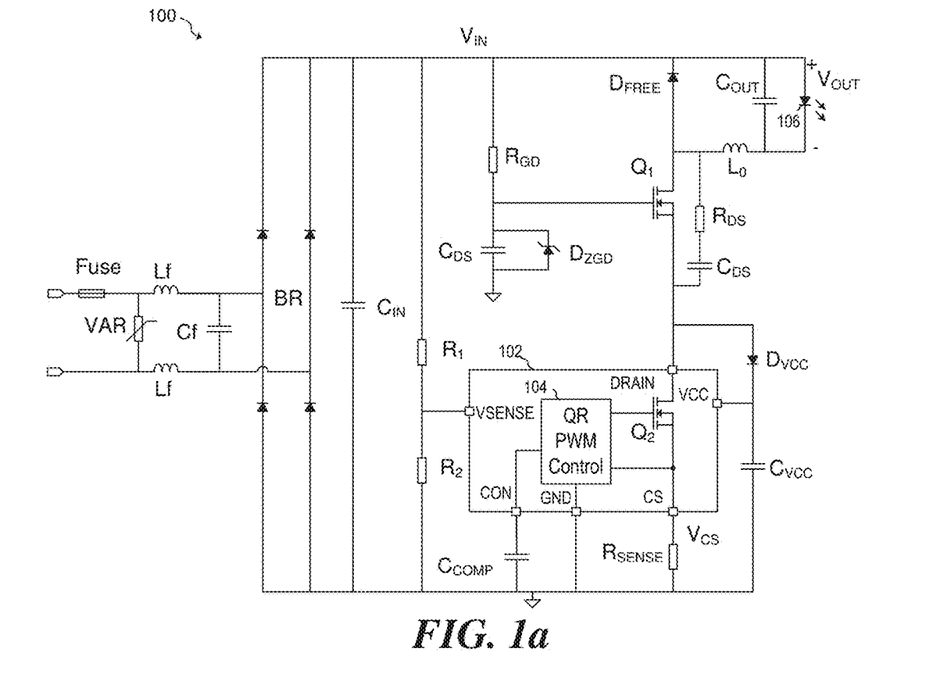
FIGS. 1a-1c illustrate a schematic of an embodiment switched-mode power supply and example current waveforms.

FIG. 1a illustrates an embodiment buck converter power supply system 100 that includes a buck converter IC 102 coupled to load circuit 106 represented as an LED via cascode transistor $Q_1$ and inductor $L_o$. IC 102, includes a control circuit 104 coupled to switching transistor $Q_2$. During operation, control circuit 104 provides a pulse width modulated (PWM) signal to the gate of switching transistor $Q_2$ using, for example a quasi-resonant mode of operation. Control circuit 104 determines a current flowing through switching transistor $Q_2$ by measuring a voltage across resistor $R_{SENSE}$, and adjusts the pulse width of the (PWM) in order to produce a fixed average current through the load. The measured voltage across resistor $R_{SENSE}$ may be further processed by performing a peak detection of the voltage, determining an average voltage, or other type of calculation. When switching transistor $Q_2$ is activated, current flows through switching transistor $Q_2$, cascode transistor $Q_1$, inductor $L_o$ and load circuit 106. When switching transistor $Q_2$ is deactivated, current flows through load circuit 106, inductor $L_o$, and freewheeling diode $D_{free}$.

Diode bridge BR rectifies input voltage VAC, which may be an AC input line voltage to provide a DC input voltage $V_{IN}$ to buck converter power supply system 100. The gate of cascode transistor $Q_1$ is biased via resistor $R_{GD}$ and zener diode $D_{ZGD}$. Capacitor $C_{DS}$ is coupled in parallel to zener diode $D_{ZGD}$ and is used to filter voltage ripple at the gate of cascode transistor $Q_1$ coming from the high frequency switching operation at the drain of $Q_1$. The Supply voltage VCC is produced for IC 102 via diode $D_{VCC}$. The voltage of VCC is about $V_{DZ}$–Vth1–$V_{DVCC}$, where $V_{DZ}$ is the zener voltage of $V_{ZGD}$, Vth1 is the threshold voltage of cascode transistor $Q_1$ and $V_{DVCC}$ is the forward voltage of diode $D_{VCC}$. For example, if the zener voltage of diode $D_{ZGD}$ is about 12 V, the threshold of cascode transistor $Q_1$ is about 3V, and the forward voltage of diode $D_{VCC}$ is 0.7 V, the resulting voltage at the VCC pin of IC 102 is about 8.3 V during startup of IC 102. After IC 102 starts up, VCC is charged by capacitor $C_{DS}$ through diode $D_{VCC}$.

As is further shown in FIG. 1, a fuse, a varistor VAR for limiting transient input voltages and a filter including inductors Lf and capacitor Cf that is used for EMI suppression during switched mode operation are also used. The series combination of capacitor CDS and resistor $R_{DS}$ provides a feed forward path from inductor $L_o$ to IC 102 for the use of zero voltage or valley detection for the quasi-resonant mode of operation. For example, after switching transistor $Q_2$ is turned off and inductor $L_o$ has been demagnetized, freewheeling diode $D_{free}$ becomes reversed biased and the drain node of cascode transistor $Q_1$ begins to ring or oscillate at a frequency determined by the value of inductor $L_o$ and the value of capacitance coupled to the drain of cascode transistor $Q_1$. By detecting minimum voltage at the drain of cascode transistor $Q_1$ during this period of ringing, and turning on switching transistor $Q_2$ when the voltage at the drain of cascode transistor $Q_1$ is at a minimum, switching losses may be reduced. Various valley switching and quasi-resonant circuits and systems known in the art may be used to implement valley switching and the quasi-resonant mode of operation in the various embodiments of the present invention.

Integrated circuit 102 includes six pins: DRAIN, CS, VCC, GND, CON and VSENSE. The DRAIN pin and the CS pins are coupled to the drain and source terminals of switching transistor $Q_2$, respectively. The VCC pin and the GND pin are coupled to the power supply for the internal circuitry of integrated circuit 102, and the CON pin interfaces with external capacitor $C_{COMP}$ that is used to establish timing of the pulse width modulated signals provided by control circuit 104. External capacitor CCOMP is used to measure output current and to control output current to have constant average output current. The VSENSE pin is coupled to the output of a voltage divider that includes resistors $R_1$ and $R_2$ in order to sense the input voltage $V_{IN}$ of the buck converter. This divided input voltage may be used, for example, to estimate output voltage $V_{OUT}$ of the buck converter.

During operation of the power supply system 100, the voltage $V_{CS}$ at pin CS of IC 102 reaches the following peak voltage at the end of the time period at which switching transistor $Q_2$ is turned on:

$$V_{CS} = \frac{V_{IN} - V_{OUT}}{L} \times T_{on} \times R_{CS}, \quad (2)$$

where $R_{CS}$ is the resistance in series with the source of switching transistor $Q_2$, $V_{IN}$ is the input voltage of the buck converter, $V_{OUT}$ is the output voltage of the buck converter, $T_{ON}$ is the on-time of switching transistor $Q_2$ and L is the inductance of inductor $L_o$. Accordingly, an expression for the virtual peak voltage of $V_{CS}$ with respect to the period at which switching transistor $Q_2$ is turned off is as follows:

$$V_{CS} = \frac{V_{OUT}}{L} \times T_{off} \times R_{CS}, \quad (3)$$

where, $T_{OFF}$ is the off-time of switching transistor $Q_2$ when current is flowing through inductor L. During off-time the voltage drop $V_{CS}$ is a virtual value, but it describes the current through the inductor L, as it starts from the same peak current, at which the on-time ends.

Since the peak values of VCS for the on-period and off-period of switching transistor $Q_2$ are equal, and because the values of $R_{CS}$ and L remain the same, equations (2) and (3) may be equated as follows:

$$\frac{V_{OUT}}{L} \times T_{off} \times R_{CS} = \frac{V_{IN} - V_{OUT}}{L} \times T_{on} \times R_{CS}.$$

canceling out the L and $R_{CS}$ terms yields:

$$V_{OUT} \times T_{off} = \{V_{IN} - V_{OUT}\} \times T_{on}.$$

This may be rearranged as follows:

$$\{T_{on} + T_{off}\} \times V_{OUT} = V_{IN} \times T_{on},$$

to finally yield:

$$V_{OUT} = \frac{T_{on}}{T_{on} + T_{off}} \times V_{IN}. \quad (4)$$

From equation (4) it is clear that given input voltage $V_{IN}$, on-time $T_{on}$ and off-time $T_{off}$ of switching transistor $Q_2$, it is possible to estimate the output voltage in a switched-mode power supply having a floating buck topology with a critical quasiresonant (QR) control mode. In alternative embodiments of the present invention, equation (4) may also be applied to other control modes such as continuous conduction mode and sensing the average inductor current in the middle of the on-time of the switch $Q_2$. In some embodiments, the on-time may be measured using its own integrated regulator and the off-time may be measured in conjunction with valley detection.

Figure 1B:
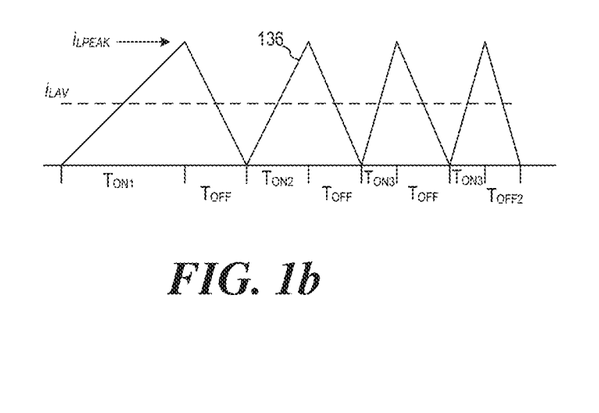

FIG. 1b illustrates an example current waveform 136 for load current during operation of embodiment buck converter power supply system 100 a mode of operation that makes use of valley switching and/or zero voltage switching for switching transistor $Q_2$ using circuits and techniques known in the art. As shown, waveform 136 illustrates a current during four charging and discharging cycles for inductor L. During the first cycle, the current through inductor L charges at a first increasing slope during $T_{ON1}$ until the current reaches $i_{LPEAK}$ and then decreases during $T_{OFF}$ at a first decreasing slope that corresponds to a first output voltage. During the second cycle, the current through inductor L charges at a second (and faster) increasing slope during $T_{ON2}$ until the current reaches $i_{LPEAK}$ and then decreases during $T_{OFF}$ at the first decreasing slope that corresponds to the same first output voltage of the first cycle. During the third cycle, the current through inductor L charges at a third (and even faster) increasing slope during $T_{ON3}$ until the current reaches $i_{LPEAK}$ and then decreases during $T_{OFF}$ at the same first decreasing slope corresponding first output voltage of the first cycle. Lastly, during the fourth cycle, the current through inductor L charges at the third increasing slope during $T_{ON3}$ (same as the previous cycle) until the current reaches $i_{LPEAK}$ and then decreases during $T_{OFF}$ at a second faster decreasing slope corresponding to a second output voltage that is higher than the first output voltage of the first three cycles.

Figure 1C:
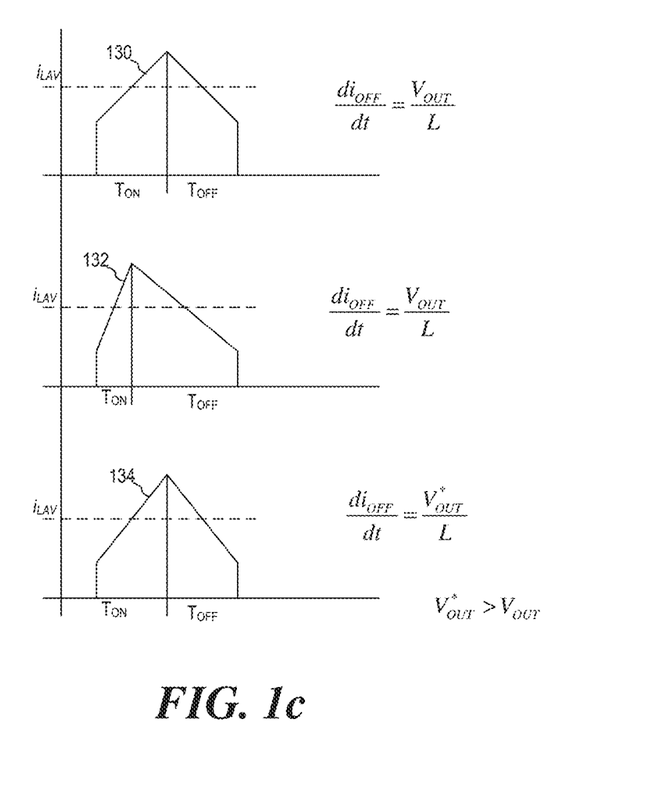

FIG. 1c illustrates example current waveforms for the load during operation of embodiment buck converter power supply system 100 during continuous conduction mode. As shown with respect to waveform 130, the load current increases linearly due to the charging of inductor L during $T_{on}$, and decreases linearly during $T_{off}$ due to the discharging of inductor L through the load. The output voltage $V_{OUT}$ is related to the slope, or first derivative of the current through the switching transistor $Q_2$ during $T_{off}$ as follows:

$$\frac{di_{OFF}}{dt} = \frac{dV_{OUT}}{L}.$$

Thus, even if the inductor is charged faster during $T_{on}$, as shown with respect to waveform 132, which shows a faster charging slope, but has the same discharging slope as waveform 132, the output voltage is the same. In some embodiments, the faster charging slope may be due to a higher input power supply voltage. As shown with respect to waveform 134, the inductor current has a steeper slope than waveform 130 and 132 during $T_{off}$, and therefore represents a higher output voltage $V^*_{OUT} > V_{OUT}$. It should be understood that the waveforms shown in FIGS. 1b and 1c are just examples of many possible waveforms during operation of embodiment systems.

In accordance with a further embodiment that operates in critical conduction mode or continuous conduction mode, a duty cycle d may be defined as follows:

$$d = \frac{T_{on}}{T_{on} + T_{off}}.$$

Accordingly, output voltage $V_{OUT}$ may also be estimated as follows:

$$V_{OUT} = d \times V_{IN}. \quad (5)$$

Thus, by measuring the duty cycle of the pulse-width modulated waveform, the output voltage may be determined.

Figure 2A:
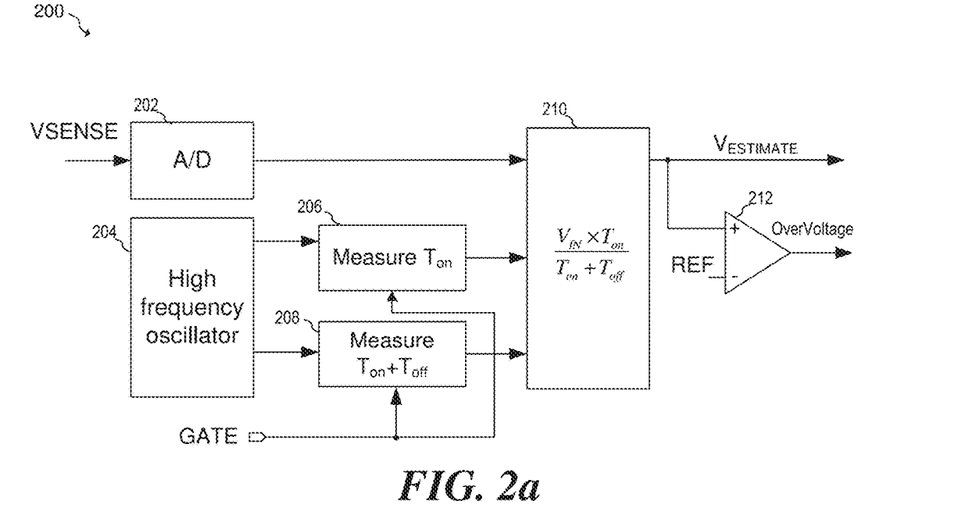
FIGS. 2a-2c illustrate schematics of various embodiments output voltage estimation circuits.
Figure 2B:
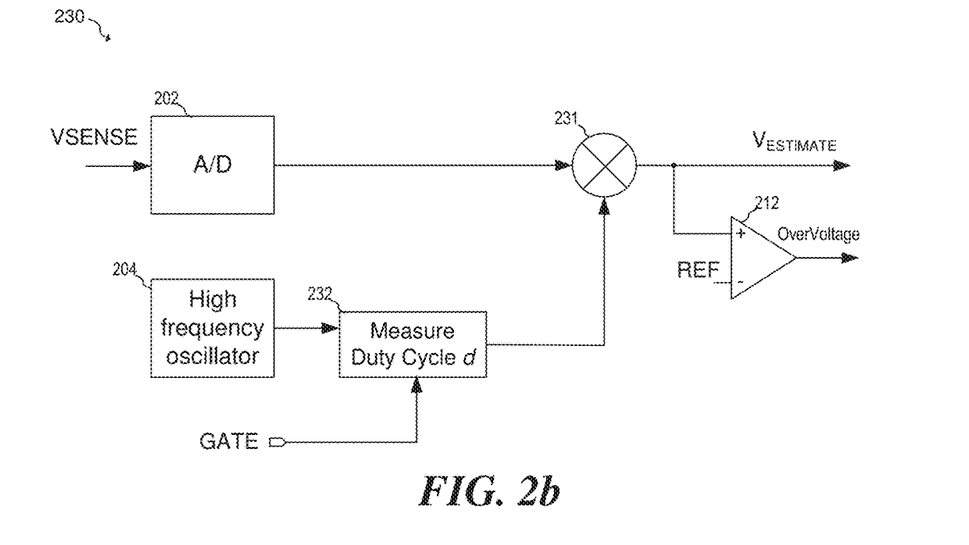
Figure 2C:
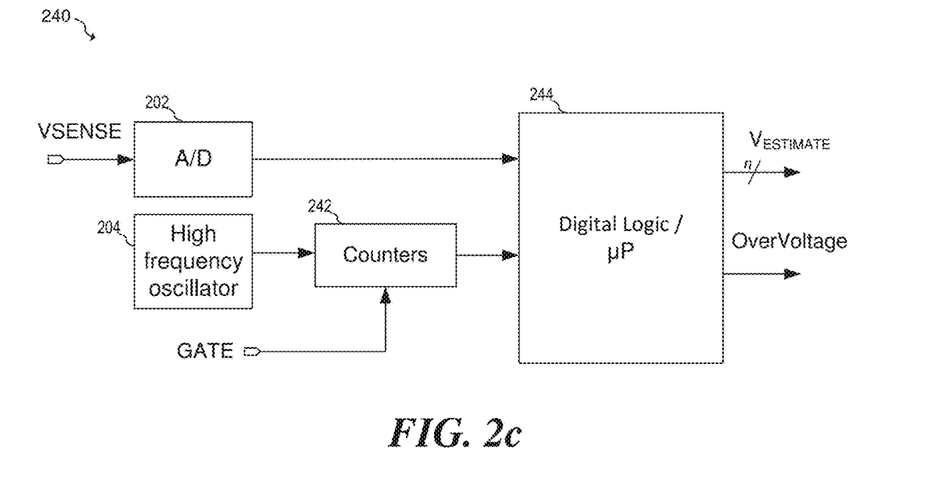

FIGS. 2a-2c illustrate various embodiment circuits that may be used to implemented embodiment output voltage estimation systems and methods. For example, FIG. 2a illustrates embodiment output voltage estimation circuit 200 that includes analog-to-digital converter 202 that digitizes the voltage at pin VSENSE shown in FIG. 1 and described above. Analog-to-digital converter 202 may be implemented using various analog-to-digital conversion circuits and systems known in the art. In one embodiment, analog-to-digital converter 202 is implemented using an 8-bit successive approximation converter that performs one conversion for every pulse width modulated switching cycle. Alternatively, other known analog-to-digital converter architectures and other resolutions may be used. In some embodiments, especially embodiments in which the input voltage to the buck converter is lowpass filtered, analog-to-digital conversions may be performed less frequently.

In an embodiment, a high frequency clock or oscillator 204 is used as a timing reference to measure the on-period of switching transistor $Q_2$ via block 206 and to measure the sum of the on-period and off-period of switching transistor $Q_2$ via block 208. In some embodiments, these time period measurements are performed by monitoring drive signal GATE that is used to produce a drive signal for switching transistor $Q_2$, and comparing drive signal GATE with respect to clock output of high frequency oscillator or clock 204. In an embodiment, the frequency of drive signal GATE is between about 10 KHz and about 100 KHz, while the frequency present at the output of high frequency oscillator or clock 204 is greater than 1 MHz, for example, between about 50 MHz and about 100 MHz. Alternatively, frequencies outside of these ranges may also be used depending on the particular application and its specification.

In an embodiment, the output of analog-to-digital converter and measurement blocks 206 and 208 are in the form of a multi-bit output. Computation block 210 calculates an estimation of the output voltage according to equation (4) described above in order to produce output voltage estimate $V_{ESTIMATE}$. In an embodiment, computation block 210 is implemented using digital logic known in the art. For example, in one embodiment, a microprocessor or a microcontroller is used to perform the calculation. Alternatively, any suitable digital logic known in the art may be used to implement computation block 210.

In some embodiments, output voltage estimate $V_{ESTIMATE}$ produced by computation block 210 may be compared to reference level REF using comparator 212 to produce overvoltage signal OverVoltage that is used to shutdown embodiment switched-mode power supply systems in the event of excessive output voltages. Comparator 212 may be implemented using a digital comparator according to digital logic methods and systems known in the art. Reference level REF may be a predefined reference level that corresponds to a safe output voltage limit of a power supply. In some embodiments, an additional scaling factor may be used to compensate for the effect of the resistor divider formed by resistors $R_1$ and $R_2$ shown in FIG. 1.

FIG. 2b illustrates embodiment output voltage estimation circuit 230 that estimates an output voltage of a switched-mode power supply based on calculating a duty cycle. As shown, measurement block 232 measured duty cycle d of the drive signal of transistor $Q_2$ as described above using the output of high frequency oscillator or clock 204 as a reference. The output measurement block 232 is multiplied by the output of analog-to-digital converter 202 using multiplier to form output voltage estimate $V_{ESTIMATE}$ according to equation (5). In some embodiments, an additional scaling factor may be used within any signal path in order to compensate for the effect of the resistor divider formed by resistors $R_1$ and $R_2$ shown in FIG. 1. In an embodiment, multiplier 231 may be implemented using a digital multiplier known in the art, a microprocessor, a microcontroller or other suitable digital logic.

FIG. 2c illustrates a hardware implementation of an embodiment output voltage estimation circuit 240 that may be used to physically implement the embodiments of FIG. 2a and FIG. 2b. As shown, embodiment output voltage estimation circuit 240 includes analog-to-digital converter 202 and high frequency oscillator 204. Counter block 242 includes digital counters that may be used to measure duty cycle d, on-time $T_{on}$ and off-time $T_{OFF}$. Digital logic block and/or microprocessor block 244 may be used to produce output voltage estimate $V_{ESTIMATE}$ as well as overvoltage signal OverVoltage.

In alternative embodiments, a clock input may be used in place of high frequency oscillator 204. Furthermore, embodiment output voltage estimation circuits may be implemented using analog circuits in place of or in addition to digital circuits.

Figure 3:
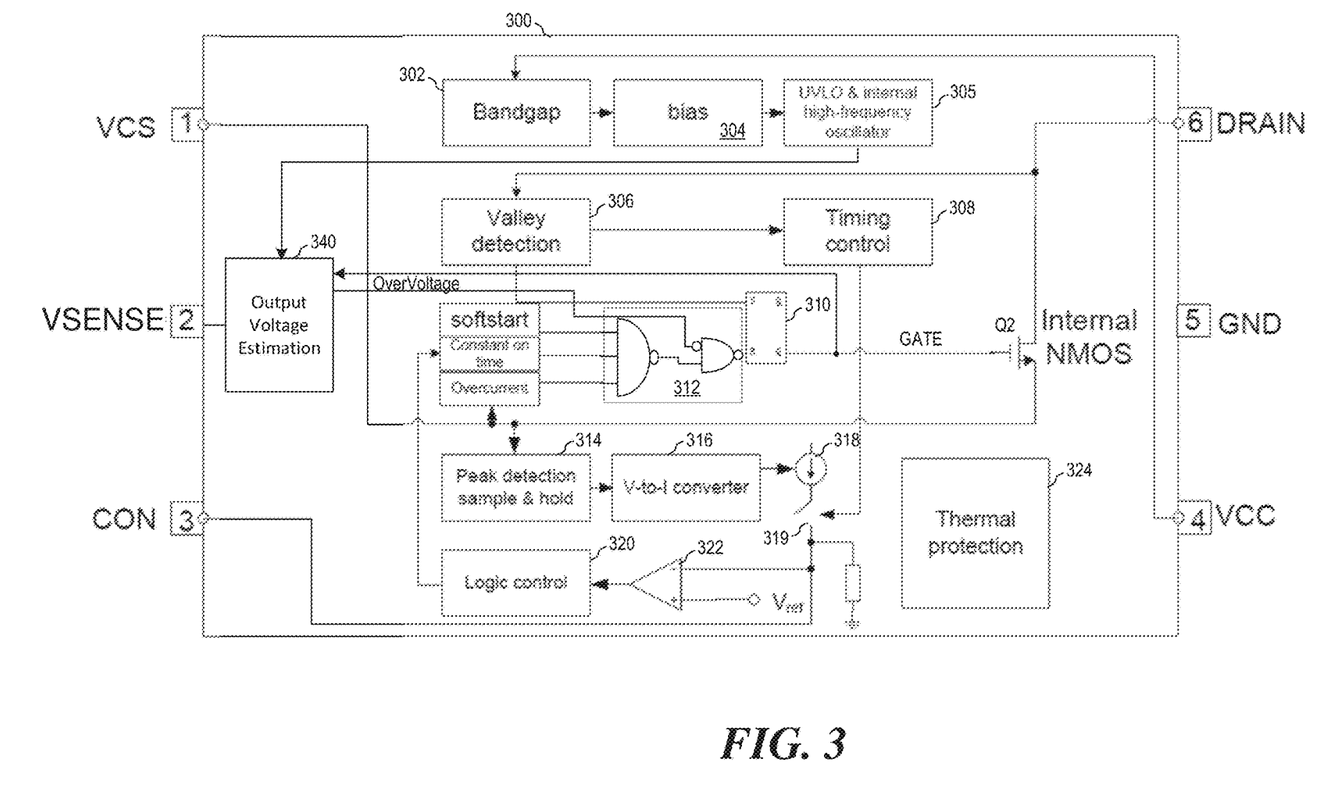
FIG. 3 illustrates an embodiment integrated circuit.

FIG. 3 illustrates IC 300 that may be used to implement buck converter IC 102 in the various embodiments described above. IC 300 includes output voltage estimation block 340 coupled to VSENSE pin 2 that may be implemented according to any of the embodiments described above. Output voltage estimation circuit 240 monitors signal GATE used to drive transistor $Q_2$ and produces over voltage signal OverVoltage.

IC 300 further includes an internal NMOS transistor $Q_2$ that is used to implement the switching transistor. The gate of transistor $Q_2$ is driven by the output of latch 310, which is activated by valley detection circuit 306 and deactivated by logic circuit 312 that resets latch 310. Latch 310 may be reset when the outputs of a soft start block, a constant on-time block and an overcurrent block are high and/or when the OverVoltage output of output voltage estimation block is asserted as determined by logic circuit 312. Effectively, when OverVoltage is asserted, transistor $Q_2$ is shut down. It should be understood that the implementation of logic circuit 312 shown in FIG. 3 is just one example of a number of possible logic circuits that may perform a similar function.

In an embodiment, the output of the soft start block is high after IC 300 has powered up, and the output of the overcurrent block is high when there is not overcurrent condition. The constant on time block provides an on-time that is based on a measured voltage of pin VCS, as well as a value of an external capacitor that is coupled to pin CON. Peak detection sample and hold block 314 samples a voltage of pin VCS and voltage to current converter 316 converts this measured peak value to a current via current source 318. When timing control block 308 activates switch 319, the external capacitor coupled to pin CON. Logic control block 320 monitors the output of comparator 322 and controls the constant on time block based the input of comparator 322 crosses threshold voltage Vref.

Bias to IC 300 is provided by bandgap 302 and bias generation block 304. IC 300 further includes an under voltage lockout mechanism and an oscillator in block 305, as well as a thermal protection block 324 that includes temperature sensor and thermal protection circuits. It should be appreciated that IC 300 is one example of many possible embodiment buck converter controller ICs. In alternative embodiments, other controller circuits and systems may be used.

Figure 4:
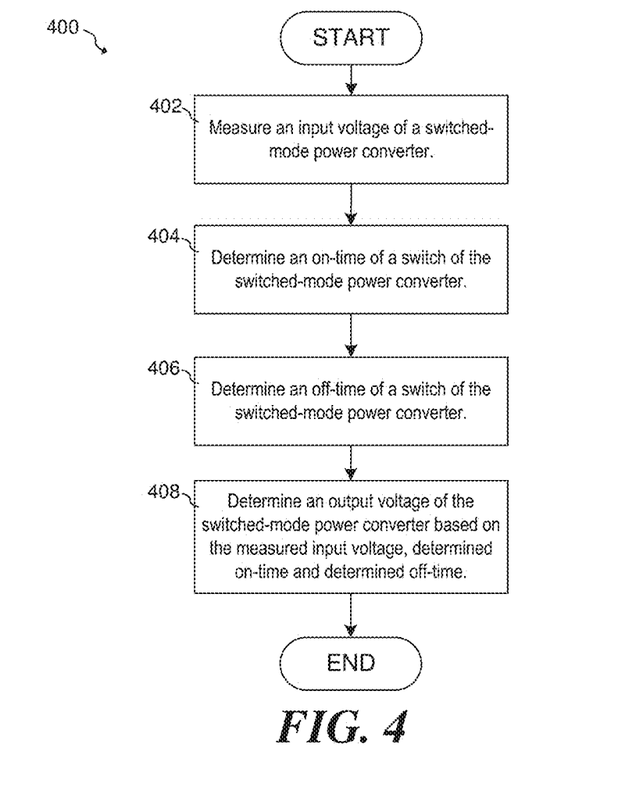
FIG. 4 illustrates a block diagram of an embodiment method.

FIG. 4 illustrates a block diagram of an embodiment method 400 of operating a switched-mode power converter. In step 402, an input of the switched-mode power converter is measured. In steps 404 and 406 the on-time and off-time of a switch of the switched-mode power converter are determined respectively. An output voltage of the switched-mode power converter is determined based on the measured input voltage, determined on-time and determined-off time in step 408 according to embodiments described above.

In accordance with various embodiments, circuits or systems may be configured to perform particular operations or actions by virtue of having hardware, software, firmware, or a combination of them installed on the system that in operation causes or cause the system to perform the actions. One general aspect includes a method of operating a switched-mode power converter that includes measuring an input voltage of the switched-mode power converter; determining an on-time of a switch of the switched-mode power converter; determining an off-time of the switch of the switched-mode power converter; and determining an output voltage of the switched-mode power converter based on the measured input voltage, the determined on-time and the determined off-time. The output voltage includes a voltage at a first node having a dc path to a load path of the switch. Other embodiments of this aspect include corresponding circuits and systems configured to perform the various actions of the methods.

Implementations may include one or more of the following features. The method further including: switching on the switch of the switched-mode power converter during the on-time of the switch; and switching off the switch of the switched-mode power converter during the off-time of the switch. In some embodiments, the switched-mode power converter includes a buck converter including an inductor that is dc coupled between the load path of the switch and the first node. The output voltage of the switched-mode power converter may be determined according to:

$$\frac{V_{input} \times T_{on}}{T_{on} + T_{off}},$$

where $V_{input}$ is the input voltage, $T_{on}$ is the on-time of the switch, and $T_{off}$ is the off-time of the switch.

In some embodiments, determining the input voltage includes performing an analog-to-digital conversion of the input voltage to produce a digitized input voltage value; and determining an on-time of the switch and determining the off-time of the switch includes monitoring a switch control signal. Monitoring the switch control signal may include monitoring the switch control signal using a counter. In an embodiment, determining the output voltage of the switched-mode power converter comprises using a digital logic circuit to calculate:

$$\frac{V_{input} \times T_{on}}{T_{on} + T_{off}},$$

where $V_{input}$ is the measured input voltage, $T_{on}$ is the on-time of the switch, and $T_{off}$ is the off-time of the switch.

The method may further include comparing the determined output voltage to a predetermined threshold and/or may further include shutting down the switched-mode power converter when the determined output voltage exceeds the predetermined threshold. In some embodiments, the method further includes operating the switched-mode power converter in a quasiresonant mode of operation and determining the off-time of the switch includes using at least one of a zero current detector and a valley detection circuit. Implementations of the described techniques may include hardware, a method or process, and or computer software on a computer-accessible medium.

A further general aspect includes a switched-mode power supply controller including: a first input configured to be coupled to a switch control signal; a second input configured to be coupled to an input voltage of a switched-mode power supply; and a calculation circuit configured to determine an on-time of a switch of the switched-mode power supply, determine an off-time of the switch of the switched-mode power supply, determine an output voltage of the switched-mode power supply based on the input voltage, the determined on-time and the determined off-time. The output voltage includes a voltage at a first node having a dc path to a load path of the switch. Other embodiments of this aspect include corresponding circuits, systems, and methods configured to implement the various elements.

Implementations may include one or more of the following features. The switched-mode power supply controller may further include a pulse modulator configured to generate the switch control signal, where the pulse modulator is configured to switch on the switch of the switched-mode power supply during the on-time of the switch, and to switch off the switch of the switched-mode power supply during the off-time of the switch. The calculation circuit may be configured to determine the output voltage of the switched-mode power supply according to:

$$\frac{V_{input} \times T_{on}}{T_{on} + T_{off}},$$

where $V_{input}$ is the input voltage, $T_{on}$ is the on-time of the switch, and $T_{off}$ is the off-time of the switch.

In some embodiments, the switched-mode power supply controller further includes an analog-to-digital converter coupled between the second input and the calculation circuit. In some implementations, the calculation circuit includes: a first counter circuit coupled to the first input, the first counter configured to determine the on-time of the switch; and a second counter circuit coupled to the second input. The second counter may be configured to determine at least one of the off-time of the switch and a sum of the on-time of the switch and the off-time of the switch.

In an embodiment, the switched-mode power supply controller further includes a digital logic circuit having a first input coupled to an output of the analog-to-digital converter, a second input coupled to an output of the first counter circuit, and a third input coupled to an output of the second counter circuit, such that the digital logic circuit configured to calculate the output voltage of the switched mode power supply according to:

$$\frac{V_{input} \times T_{on}}{T_{on} + T_{off}},$$

where $V_{input}$ is the input voltage determined by the analog-to-digital converter, $T_{on}$ is the on-time of the switch determined by the first counter circuit, and $T_{off}$ is the off-time of the switch determined by the second counter circuit. In an embodiment, the switched-mode power supply controller where the analog-to-digital converter and the calculation circuit are disposed on a semiconductor substrate.

In an embodiment, the calculation circuit further includes a comparator configured to compare the determined output voltage to a predetermined threshold; and shutdown the switched-mode power supply when the determined output voltage exceeds the predetermined threshold. The switched-mode power supply controller may be configured to operate a switched-mode buck converter including an inductor that is dc coupled between the load path of the switch and the first node. Implementations of the described techniques may include hardware, a method or process, or computer software on a computer-accessible medium.

One general aspect includes a light emitting diode (LED) power supply including: a first integrated circuit having: a first switch, a controller configured to control a first current through the first switch by modulating a first switching signal provided to a control node of the first switch, and a calculation circuit having a first input coupled to the first switching signal and a second input coupled to a power input node of the led power supply. The calculation circuit is configured to determine an on-time of the first switch, determine an off-time of the first switch, and determine an output voltage of the led power supply based on a voltage at the first input, the determined on-time and the determined off-time. The output voltage of the led power supply includes a voltage at an output port having a DC path to a load path of the first switch. Other embodiments of this aspect include corresponding circuits and systems and methods configured to implement the various elements.

Implementations may include one or more of the following features. The LED power supply may further include: an inductor that is DC coupled between an output node of the first switch and the output port of the led power supply; and a freewheeling diode coupled between the output of the first switch and the power input node. In some embodiments, the LED power supply further includes a rectifier coupled between an AC input port and the power input node and/or includes an LED coupled to an output port of the of the led power supply. The LED power supply may further include a resistive voltage divider coupled to the power input node and the first input of the calculation circuit. Implementations of the described techniques may include hardware, a method or process, or computer software on a computer-accessible medium.

A further general aspect includes a method of operating a switched-mode power converter that includes measuring an input voltage of the switched-mode power converter; determining a duty cycle of a switch of the switched-mode power converter; and determining an output voltage of the switched-mode power converter based on the measured input voltage and the determined duty cycle. Other embodiments of this aspect include corresponding circuits and systems configured to perform the various actions of the methods.

Implementations may include one or more of the following features. The method where determining the output voltage of the switched-mode power converter includes calculating $V_{input} \times d$, wherein $V_{input}$ is the measured input voltage and d is the determined duty cycle. Implementations of the described techniques may include hardware, a method or process, or computer software on a computer-accessible medium.

Advantages of some embodiments include the ability to accurately estimate the output voltage of a switched-mode power supply without using an auxiliary winding and without performing a direct measurement of the output voltage of the switched-mode power supply. Some advantageous embodiments only need an extra two external resistors to divide the input voltage to the switched-mode power supply.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media that is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. In addition, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. In addition, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of intraoperative hardware units, including one or more processors as described above, in conjunction with suitable software and/or firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a switched-mode power converter, the method comprising:
    measuring an input voltage of the switched-mode power converter;
    monitoring a switch control signal of a switch of the switched-mode power converter;
    measuring an on-time of a switch of the switched-mode power converter from the monitored switch control signal;
    measuring an off-time of the switch of the switched-mode power converter from the monitored switch control signal;
    estimating an output voltage of the switched-mode power converter based on the measured input voltage, the measured on-time and the measured off-time, wherein the output voltage comprises a voltage at a first node having a DC path to a load path of the switch;
    determining a first signal based on the estimated output voltage and a reference signal; and
    performing an action on the switched-mode power converter based on the estimated output voltage, wherein performing the action on the switched-mode power converter comprises turning-off the switch based on the first signal.

2. The method of claim 1, wherein determining the first signal comprises comparing the estimated output voltage with the reference signal.

3. The method of claim 1, further comprising:
    switching on the witch of the switched-mode power converter during the on-time of the switch; and
    switching off the switch of the switched-mode power converter during the off-time of the switch.

4. The method of claim 1, wherein the switched-mode power converter comprises a buck converter comprising an inductor that is DC coupled between the load path of the switch and the first node.

5. The method of claim 1, wherein the output voltage of the switched-mode power converter is estimated according to:

$$\frac{V_{input} \times T_{on}}{T_{on} + T_{off}},$$

where $V_{input}$ is the measured input voltage, $T_{on}$ is the measured on-time of the switch, and $T_{off}$ is the measured off-time of the switch.

6. The method of claim 1, wherein:
    measuring the input voltage comprises performing an analog-to-digital conversion of the input voltage to produce a digitized input voltage value.

7. The method of claim 6, wherein estimating the output voltage of the switched-mode power converter comprises using a digital logic circuit to calculate:

$$\frac{V_{input} \times T_{on}}{T_{on} + T_{off}},$$

where $V_{input}$ is the measured input voltage, $T_{on}$ is the measured on-time of the switch, and $T_{off}$ is the measured off-time of the switch.

8. The method of claim 1, wherein monitoring the switch control signal comprises monitoring the switch control signal using a counter.

9. The method of claim 1, further comprising:
    operating the switched-mode power converter in a quasiresonant mode of operation; and
    measuring the off-time of the switch comprises using at least one of a zero current detector and a valley detection circuit.

10. The method of claim 1, wherein:
    measuring the input voltage of the switched-mode power converter comprises using a voltage divider; and
    measuring the on-time of the switch of the switched-mode power converter comprises using calculation circuit.

11. The method of claim 1, further comprising biasing a control node of a transistor coupled in series with the switch, biasing comprising:
    coupling the control node of the transistor to a reference node via a zener diode coupled in parallel with a capacitor; and
    coupling the control node to the input voltage via a resistor.

12. A switched-mode power supply controller comprising:
    a first input coupled to a switch control terminal;
    a second input coupled to an input voltage of a switched-mode power supply; and
    a calculation circuit configured to
        monitor a switch control signal at the switch control terminal, measure an on-time of a switch of the switched-mode power supply based on the monitored switch control signal,
        measure an off-time of the switch of the switched-mode power supply based on the monitored switch control signal,
        estimate an output voltage of the switched-mode power supply based on the input voltage, the measured on-time and the measured off-time, wherein the output voltage comprises a voltage at a first node having a DC path to a load path of the switch,
        produce a first signal based on a difference between the estimated output voltage and a reference signal, and
        perform an action on the switched-mode power supply based on the estimated output voltage, wherein the action comprises turning-off the switch based on the first signal.

13. The switched-mode power supply controller of claim 12, wherein the calculation circuit comprises a comparator configured to produce the first signal.

14. The switched-mode power supply controller of claim 12, further comprising a pulse modulator configured to generate the switch control signal, wherein the pulse modulator is configured to switch on the switch of the switched-mode power supply during the on-time of the switch, and to switch off the switch of the switched-mode power supply during the off-time of the switch.

15. The switched-mode power supply controller of claim 12, wherein the calculation circuit is configured to estimate the output voltage of the switched-mode power supply according to:

$$\frac{V_{input} \times T_{on}}{T_{on} + T_{off}},$$

where $V_{input}$ is the input voltage, $T_{on}$ is the measured on-time of the switch, and $T_{off}$ is the measured off-time of the switch.

16. The switched-mode power supply controller of claim 12, further comprising an analog-to-digital converter coupled between the second input and the calculation circuit.

17. The switched-mode power controller of claim 16, wherein the calculation circuit comprises:
   a first counter circuit coupled to the first input, the first counter circuit configured to measure the on-time of the switch; and
   a second counter circuit coupled to the second input, the second counter circuit configured to measure at least one of the off-time of the switch and a sum of the on-time of the switch and the off-time of the switch.

18. The switched-mode power supply controller of claim 17, further comprising a digital logic circuit having a first input coupled to an output of the analog-to-digital converter, a second input coupled to an output of the first counter circuit, and a third input coupled to an output of the second counter circuit, the digital logic circuit configured to estimate the output voltage of the switched-mode power supply according to:

$$\frac{V_{input} \times T_{on}}{T_{on} + T_{off}},$$

where $V_{input}$ is the input voltage determined by the analog-to-digital converter, $T_{on}$ is the on-time of the switch measured by the first counter circuit, and $T_{off}$ is the off-time of the switch measured by the second counter circuit.

19. The switched-mode power supply controller of claim 17, wherein the analog-to-digital converter and the calculation circuit are disposed on a semiconductor substrate.

20. The switched-mode power supply controller of claim 12, wherein the switched-mode power supply controller is configured to operate a switched-mode buck converter comprising an inductor that is DC coupled between the load path of the switch and the first node.

21. The switched-mode power supply controller 12, further comprising a biasing circuit, the biasing circuit comprising:
   a resistor coupled between the second input and a biasing node configured to be coupled to a control node of a transistor coupled in series with the load path of the switch;
   a capacitor coupled between the biasing node and reference node; and
   a zener diode coupled between the biasing node and the reference node, wherein the calculation circuit comprises at least one counter configured to measure the on-time of the switch and the off-time of the switch.

22. The switched-mode power supply controller of claim 21, further comprising the switch and the transistor.

23. A light emitting diode (LED) power supply comprising:
   a first integrated circuit comprising:
      a first switch,
      a controller configured to control a first current through the first switch by modulating a first switching signal provided to a control node of the first switch, and
      a calculation circuit comprising a first input coupled to a power input node of the LED power supply and a second input coupled to the first switching signal, the calculation circuit configured to
      monitor the first switching signal,
      measure an on-time of the first switch based on monitoring the first switching signal,
      measure an off-time of the first switch based on monitoring the first switching signal, and
      estimate an output voltage of the LED power supply based on a voltage at the first input, the measured on-time and the measured off-time, wherein the output voltage of the LED power supply comprises a voltage at an output port having a DC path to a load path of the first switch,
      produce a first signal based on a difference between the estimated output voltage and a reference signal, and
      cause the LED power supply to perform an action based on the estimated output voltage, wherein the action comprises turning-off the first switch based on the first signal.

24. The LED power supply of claim 23, further comprising:
   an inductor that is DC coupled between an output node of the first switch and the output port of the LED power supply;
   a freewheeling diode coupled between the output node of the first switch and the power input node;
   a rectifier coupled between an AC input port and the power input node; and
   a resistive voltage divider coupled to the power input node and the first input of the calculation circuit.

25. The LED power supply of claim 23, further comprising an LED coupled to an output port of the of the LED power supply.

26. The LED power supply of claim 23, further comprising:
   a transistor coupled in series with the first switch;
   a resistor coupled between the power input node of the LED power supply and a control node of the transistor;
   a capacitor coupled between the control node of the transistor and a reference node; and
   a zener diode coupled between control node of the transistor and the reference node, wherein the calculation circuit comprises a counter configured to measure the on-time of the first switch and the off-time of the first switch.

27. The LED power supply of claim 23, wherein the calculation circuit comprises a comparator configured to produce the first signal.

* * * * *

UNITED STATES PATENT AND TRADEMARK OFFICE
CERTIFICATE OF CORRECTION

PATENT NO. : 10,148,175 B2
APPLICATION NO. : 15/964505
DATED : December 4, 2018
INVENTOR(S) : Michael Herfurth et al.

Page 1 of 1

It is certified that error appears in the above-identified patent and that said Letters Patent is hereby corrected as shown below:

In the Claims

In Column 15, Line 11, Claim 17, delete "power controller" and insert --power supply controller--.

In Column 15, Line 46, Claim 21, delete "power supply controller 12," and insert --power supply controller of claim 12,--.

Signed and Sealed this
Nineteenth Day of February, 2019

Andrei Iancu
*Director of the United States Patent and Trademark Office*